United States Patent
Huddar

(10) Patent No.: US 10,410,683 B2
(45) Date of Patent: Sep. 10, 2019

(54) TIGHTLY COUPLED DIFFERENTIAL VIAS

(71) Applicant: SEAGATE TECHNOLOGY LLC, Cupertino, CA (US)

(72) Inventor: Vinod Arjun Huddar, Karnataka (IN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/842,290

(22) Filed: Dec. 14, 2017

(65) Prior Publication Data
US 2019/0189164 A1  Jun. 20, 2019

(51) Int. Cl.
| H05K 5/00 | (2006.01) |
| G11B 33/12 | (2006.01) |
| H05K 3/40 | (2006.01) |
| G06F 1/18 | (2006.01) |
| H05K 1/11 | (2006.01) |

(52) U.S. Cl.
CPC ............ G11B 33/124 (2013.01); G06F 1/187 (2013.01); H05K 1/115 (2013.01); H05K 3/4038 (2013.01)

(58) Field of Classification Search
CPC ....... G11B 33/124; G06F 1/187; H05K 1/115; H05K 3/4038
USPC ................................................ 361/753, 761
See application file for complete search history.

(56) References Cited

U.S. PATENT DOCUMENTS

| 7,705,246 B1* | 4/2010 | Pritchard ............. | H05K 1/0222 174/262 |
| 8,076,590 B2* | 12/2011 | Zhao .................... | H05K 1/0245 174/255 |
| 8,552,308 B2* | 10/2013 | Lee ....................... | H05K 1/0245 174/255 |
| 8,885,357 B2* | 11/2014 | Kim ...................... | H05K 1/115 174/262 |
| 8,895,872 B2* | 11/2014 | Pai .......................... | H05K 1/11 174/250 |
| 9,560,741 B2 | 1/2017 | Rose et al. | |
| 2004/0150970 A1* | 8/2004 | Lee ....................... | H05K 1/0251 361/794 |
| 2005/0202722 A1* | 9/2005 | Regnier ............... | H05K 1/0222 439/607.05 |
| 2009/0015345 A1 | 1/2009 | Kushta et al. | |
| 2009/0190277 A1* | 7/2009 | Hiew .................... | G06F 1/1632 361/56 |
| 2009/0315158 A1* | 12/2009 | Maetani .............. | H05K 1/0245 257/664 |
| 2012/0325542 A1* | 12/2012 | Yokoyama .......... | H05K 1/0251 174/262 |
| 2013/0098671 A1 | 4/2013 | Thurairajaratnam et al. | |
| 2013/0112470 A1* | 5/2013 | Ao ....................... | H05K 1/0251 174/266 |

* cited by examiner

Primary Examiner — Hung S. Bui
(74) Attorney, Agent, or Firm — Holland & Hart LLP

(57) ABSTRACT

Systems and methods for tightly coupled differential vias are described. the storage system device includes a storage drive and a printed circuit board (PCB) of the storage drive. In some embodiments a first via is connected to a first trace routed on a first layer of the PCB, and a second via is connected to a second trace routed on the first layer of the PCB. In some cases, a distance between the first via and the second via is about 1.5 times or less a spacing between the first trace and the second trace.

18 Claims, 8 Drawing Sheets

TIGHTLY COUPLED DIFFERENTIAL VIAS

SUMMARY

The present disclosure is directed to methods and systems for tightly coupled differential vias. In some embodiments, the present systems and methods may place differential vias relatively close to each other to reduce inter-differential pair crosstalk between pairs of differential vias and/or pairs of differential traces.

A storage system for tightly coupled differential vias is described. In one embodiment, the storage system device may include a storage drive and a printed circuit board (PCB) of the storage drive. In some embodiments, a first via may be connected to a first trace routed on a first layer of the PCB. Additionally or alternatively, a second via may be connected to a second trace routed on the first layer of the PCB. In some cases, a distance between the first via and the second via may be about 1.5 times or less a spacing between the first trace and the second trace.

In one embodiment, a ground via may be placed relatively near the first via and the second via. In some cases, a spacing between a conductive edge of the ground via and a conductive edge of the first via or between the conductive edge of ground via and a conductive edge of the second via may be about 1.5 times or less a width between the first trace and the second trace.

In one embodiment, the first trace extends out from the first via and the second trace may extend in parallel out from the second via. In some embodiments, the first trace and the second trace bend away together from the first via and the second via after extending out from the first via and the second via. In some cases, a predetermined trace width between the first trace and the second trace may be maintained before, during, and after the bending away.

In one embodiment, a first antipad on the first layer of the PCB may surround the first via. In some cases, a second antipad on the first layer of the PCB may surround the second via. In some cases, a spacing between the first antipad and a conductive edge of the first via may be about 1.5 times or less a width between the first trace and the second trace. In some cases, a spacing between the second antipad and a conductive edge of the second via may be about 1.5 times or less a width between the first trace and the second trace. In some embodiments, the spacing of the first antipad and/or the second antipad may be based at least in part on a selected single ended impedance of the first via or a selected differential impedance between the first via and the second via, or both.

In one embodiment, the first via and the second via may be differentially paired vias. In some cases, the first trace and the second trace may be differentially paired traces. In some embodiments, the first via may electrically connect the first trace to a second layer of the PCB and the second via may electrically connect the second trace to the second layer of the PCB.

In one embodiment, the first via or the second via may include a through hole via, a blind via, or a buried via, or any combination thereof. In some cases, the first via or the second via may include at least one of a barrel, a pad, and an antipad, or any combination thereof. In some cases, the barrel or the pad may include a conductive edge.

In one embodiment, the first via and the second via may electrically connect a serializer/deserializer (SerDes) of a connector of a storage drive to a SerDes of a controller of the storage drive.

In one embodiment, the storage drive connector may include at least one of a serial advanced technology attachment (SATA) connector, mini SATA (mSATA) connector, SATA Express connector, small computer system interface (SCSI) connector, serially attached SCSI (SAS) connector, peripheral component interconnect express (PCIe) connector, M.2 connector, U.2 connector, non-volatile memory express (NVMe) connector, a universal serial bus (USB) connector, or any combination thereof.

In one embodiment, a differential impedance between the first via and the second via may depend on at least one or more physical aspects of the first via and the second via. In some cases, the one or more physical aspects of the first via and the second via may include at least one of a distance between the first via and the second via, a width of a pad of the first via, a width of a pad of the second via, a width of a barrel of the first via, a width of a barrel of the second via, a height of a barrel of the first via, a height of a barrel of the second via, a dimension of a first reference plane, a dimension of a second reference plane, a distance between the first via and the first or second reference plane, a distance between the second via and the first or second reference plane, or any combination thereof.

An apparatus for tightly coupled differential vias is also described. In one embodiment, the apparatus may include a processor, memory in electronic communication with the processor, and instructions stored in the memory, the instructions being executable by the processor to perform the steps of generating a printed circuit board (PCB) and placement and/or routing of components on the PCB. In some embodiments a first via may be connected to a first trace routed on a first layer of the PCB. Additionally or alternatively, a second via may be connected to a second trace routed on the first layer of the PCB. In some cases, a distance between the first via and the second via may be 1.5 times or less a spacing between the first trace and the second trace.

A method for tightly coupled differential vias is also described. In one embodiment, the method may include connecting a first via to a first trace routed on a first layer of a printed circuit board (PCB), connecting a second via to a second trace routed on the first layer of the PCB, and placing a ground via adjacent to the first via and the second via. In some cases, a distance between the first via and the second via may be based at least in part on a spacing between the first trace and the second trace. In some cases, placement of the first via, placement of the second via, or placement of the ground via, or any combination thereof, may enable at least one of a predetermined differential impedance of the first via and the second via, a predetermined single ended impedance of the first via or the second via, or a minimization of crosstalk between the first and second vias and a second pair of vias, or any combination thereof.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, including their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components, including those having a dash and a second reference label, apply to other similar components. If only the first reference label is used in the specification, the description is applicable to any one of the similar components having the same first reference label irrespective of the second reference label.

DETAILED DESCRIPTION

Figure 1:
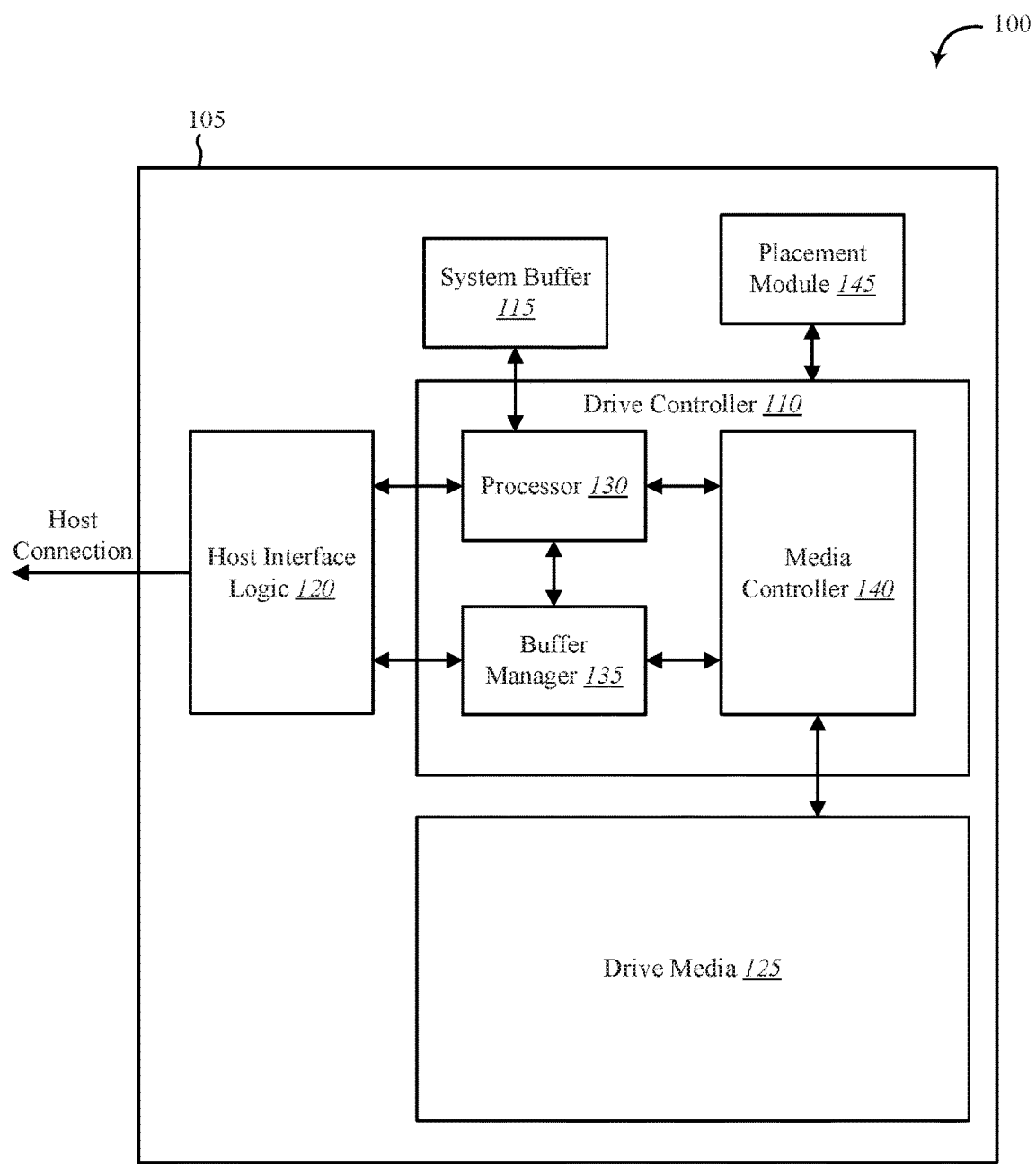
FIG. 1 shows a block diagram of a device in accordance with various aspects of this disclosure.

The following relates generally to tightly coupled differential vias. In one embodiment, serializer/deserialiser (SerDes) differential via design may be a challenge for integrated circuit designers for SerDes that operate in the gigabit range (Gbps). These SerDes differential vias may cause discontinuity for signals as well as crosstalk with neighboring SerDes differential vias that are part of a common interface such as a peripheral component interconnect express (PCIe) 16-bit bus interface. The present systems and methods includes a differential via design that solves the discontinuity problem while minimizing crosstalk with neighboring differential vias.

When it comes to SerDes systems, the data rate may be limited by the printed circuit board (PCB) interconnects such as vias, connectors, etc. Thus, Signal Integrity (SI) becomes an important performance metric for high-speed designs to achieve the maximum possible bandwidth. Designing differential vias for SerDes Gbps signals is a challenge for Signal Integrity (SI) engineers. Designing via impedance to match trace impedance may include adjusting pad sizes, anti-pad sizes, via drill sizes, etc. Ensuring SI may also be based at least in part on providing return path ground/power via for signal via and its spacing.

Differential vias may have their own set of parameters to be optimized. In some cases, ground vias may be used to provide a return path for common mode signals. The number of ground vias and their locations may improve SI. Having multiple differential vias in parallel is a common scenario in PCB especially for interface like PCIe where there may be a 32-bit bus (×32) or 16-bit bus (×16). In some cases, differential via to via crosstalk is an issue in these interfaces as they pump data at Gbps data rates. The present systems and methods include a differential via design that reduces the crosstalk to neighboring differential vias without adversely affecting the signal quality.

Differential Vias are typically routed as far away from each other as possible, curving away from the attached traces. In conventional designs, individual vias may be designed with an impedance of 50 Ohms so that differential via impedance can be designed to 100 Ohms. With conventional differential vias, traces spread apart before entering the respective vias. The spreading apart may causes differential impedance to increase at each via. The anti-pad may be adjusted to meet an impedance requirement. Adjusting anti-pad to meet impedance holds good for, for example, 100 Ohm differential pairs and with stack-up's with large number of layers so that there are large numbers of anti-pads. This is not the case when the stack-up is 4 layers and the impedance of the differential trace is, for example, 85 Ohms such as in the case of a PCIe interface. Having lesser layers results in lesser capacitive effect and spreading the traces results in the impedance increasing. To solve this problem, the present systems and methods include differential vias designed to have a lower single ended via impedance and thus a lower differential via impedance, such as having a differential via impedance of 85 Ohms instead of 100 Ohms, or a 42 Ohms single ended via instead of 50 ohms. The present systems and methods may include a single ended impedance discontinuity where traces coming to vias are designed to 50 Ohms and the vias are designed to 42.5 Ohms, showing up in common mode return loss plots or time domain reflectometer (TDR) plots. However, the present systems and methods may still work for many current industry interfaces such as PCIe or serially attached small computer system interface (SAS) or universal serial bus (USB) because common mode return loss specifications are relaxed for such interfaces as such interfaces only worry about differential insertion loss or return loss.

It may be typical to have multiple differential pairs such as a PCIe ×16 or ×32 interface where 16 or 32 differential pairs are routed together in parallel. Differential via to differential via crosstalk is an issue in such cases as multiple differential vias are communicating signals in parallel to each other. With the present systems and methods, a pair of differential vias are placed relatively close to each other with more or less the same spacing as trace-to-trace spacing. Placing a pair of differential vias relatively close may ensure that single ended impedance remain 50 Ohms, and due to the relatively close spacing, differential impedance between the vias may come to 85 Ohms as the vias are electromagnetically tightly coupled. In some cases, the differential via structure of the present systems and methods may include traces that bend slightly away from the vias.

When comparing conventional differential via design to the relatively close differential design of the present systems and methods, an improvement of 4 dB is seen in the far end crosstalk (FEXT) plots, while near end crosstalk (NEXT) comparisons sees an improvement of 7 dB over conventional design. The NEXT and FEXT for the differential via structure of the present systems and methods is 4 dB less as compared to conventional differential vias at 0/180 degree and 90/270 degree angle between inter-pair vias. Even higher improvements are seen with all other angles between inter-pair vias in NEXT and FEXT.

Since the differential vias are tightly coupled, the crosstalk on neighboring differential vias is minimized. Due to physical proximity, the PCB real estate is also reduced, thus further increasing the gap between differential pair via to next differential pair via, which results in an even further reduction in crosstalk between differential pairs of vias. In some cases, anti-pads may be designed to achieve custom impedance. In some cases, a ground via may be provided for common mode currents to return.

FIG. 1 shows a block diagram 100 of an apparatus 105 for use in electronic communication, in accordance with various aspects of this disclosure. The apparatus 105 may be an example of one or more aspects of device 105 described with reference to FIG. 1. The apparatus 105 may include a drive controller 110, system buffer 115, host interface logic 120, drive media 125, and placement module 145. Each of these components may be in communication with each other and/or other components directly and/or indirectly.

One or more of the components of the apparatus 105, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used such as Structured/Platform ASICs, Field Programmable Gate Arrays (FPGAs), and other Semi-Custom ICs, which may be programmed in any manner known in the art. The functions of each module may also be implemented, in whole or in part, with instructions embodied in memory formatted to be executed by one or more general and/or application-specific processors.

In one embodiment, the drive controller 110 may include a processor 130, a buffer manager 135, and a media controller 140. The drive controller 110 may process, via processor 130, read and write requests in conjunction with the host interface logic 120, the interface between the apparatus 105 and the host of apparatus 105. The system buffer 115 may hold data temporarily for internal operations of apparatus 105. For example, a host may send data to apparatus 105 with a request to store the data on the drive media 125. Drive media 125 may include one or more disk platters, flash memory, any other form of non-volatile memory, or any combination thereof. The driver controller 110 may process the request and store the received data in the drive media 125. In some cases, a portion of data stored in the drive media 125 may be copied to the system buffer 115 and the processor 130 may process or modify this copy of data and/or perform an operation in relation to this copy of data held temporarily in the system buffer 115.

In some embodiments, placement module 145 may include at least one of one or more processors, one or more memory devices, one or more storage devices, instructions executable by one or more processors stored in one or more memory devices and/or storage devices, or any combination thereof. Although depicted outside of drive controller 110, in some embodiments, placement module 145 may include software, firmware, and/or hardware located within drive controller 110 and/or operated in conjunction with drive controller 110. For example, placement module 145 may include at least a portion of processor 130, buffer manager 135, and/or media controller 140. In one example, placement module 145 may include one or more instructions executed by processor 130, buffer manager 135, and/or media controller 140. In some cases, placement module 145 may generate a printed circuit board (PCB) and place and/or route components on the PCB to reduce inter-differential pair crosstalk between pairs of differential vias and/or pairs of differential traces of the PCB.

Figure 2:
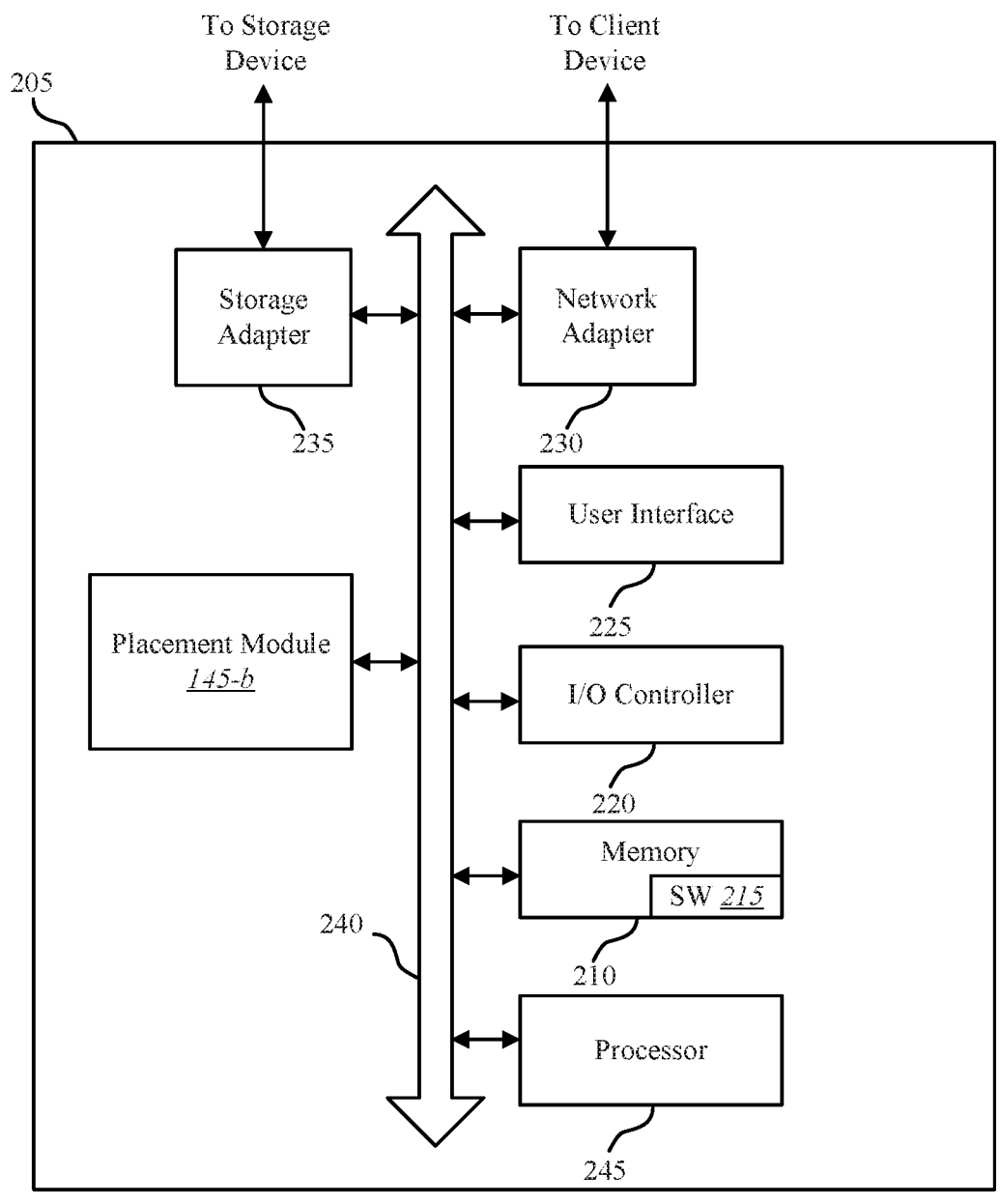
FIG. 2 shows a block diagram of one or more modules in accordance with various aspects of this disclosure.

FIG. 2 shows a system 200 for tightly coupled differential vias, in accordance with various examples. System 200 may include an apparatus 205, which may be an example of any one of device 105 of FIG. 1.

Apparatus 205 may include components for bi-directional voice and data communications including components for transmitting communications and components for receiving communications. For example, apparatus 205 may communicate bi-directionally with one or more storage devices and/or client systems. This bi-directional communication may be direct (apparatus 205 communicating directly with a storage system, for example) and/or indirect (apparatus 205 communicating indirectly with a client device through a server, for example).

Apparatus 205 may also include a processor module 245, and memory 210 (including software/firmware code (SW) 215), an input/output controller module 220, a user interface module 225, a network adapter 230, and a storage adapter 235. The software/firmware code 215 may be one example of a software application executing on apparatus 205. The network adapter 230 may communicate bi-directionally, via one or more wired links and/or wireless links, with one or more networks and/or client devices. In some embodiments, network adapter 230 may provide a direct connection to a client device via a direct network link to the Internet via a POP (point of presence). In some embodiments, network adapter 230 of apparatus 205 may provide a connection using wireless techniques, including digital cellular telephone connection, Cellular Digital Packet Data (CDPD) connection, digital satellite data connection, and/or another connection. The apparatus 205 may include placement module 145-*b*, which may perform one or more functions described with reference to the placement module 145 of FIG. 1.

The signals associated with system 200 may include wireless communication signals such as radio frequency, electromagnetics, local area network (LAN), wide area network (WAN), virtual private network (VPN), wireless network (using 802.11, for example), cellular network (using 3G and/or LTE, for example), and/or other signals. The network adapter 230 may enable one or more of WWAN (GSM, CDMA, and WCDMA), WLAN (including BLUETOOTH® and Wi-Fi), WMAN (WiMAX) for mobile communications, antennas for Wireless Personal Area Network (WPAN) applications (including RFID and UWB), or any combination thereof.

One or more buses 240 may allow data communication between one or more elements of apparatus 205 such as processor module 245, memory 210, I/O controller module 220, user interface module 225, network adapter 230, and storage adapter 235, or any combination thereof.

The memory 210 may include random access memory (RAM), read only memory (ROM), flash memory, and/or other types. The memory 210 may store computer-readable, computer-executable software/firmware code 215 including instructions that, when executed, cause the processor module 245 to perform various functions described in this disclosure. Alternatively, the software/firmware code 215 may not be directly executable by the processor module 245 but may cause a computer (when compiled and executed, for example) to perform functions described herein. Alternatively, the computer-readable, computer-executable software/firmware code 215 may not be directly executable by the processor module 245, but may be configured to cause a computer, when compiled and executed, to perform functions described herein. The processor module 245 may include an intelligent hardware device, for example, a central processing unit (CPU), a microcontroller, an application-specific integrated circuit (ASIC), field programmable gate array (FPGA), or any combination thereof.

In some embodiments, the memory 210 may contain, among other things, the Basic Input-Output system (BIOS) which may control basic hardware and/or software operation such as the interaction with peripheral components or devices. For example, at least a portion of the placement module 145-b to implement the present systems and methods may be stored within the system memory 210. Applications resident with system 200 are generally stored on and accessed via a non-transitory computer readable medium, such as a hard disk drive or other storage medium. Additionally, applications can be in the form of electronic signals modulated in accordance with the application and data communication technology when accessed via a network interface such as network adapter 230.

Many other devices and/or subsystems may be connected to and/or included as one or more elements of system 200 (for example, a personal computing device, mobile computing device, smart phone, server, internet-connected device, cell radio module, or any combination thereof). In some embodiments, all of the elements shown in FIG. 2 need not be present to practice the present systems and methods. The devices and subsystems can be interconnected in different ways from that shown in FIG. 2. In some embodiments, an aspect of some operation of a system, such as that shown in FIG. 2, may be readily known in the art and are not discussed in detail in this application. Code to implement the present disclosure can be stored in a non-transitory computer-readable medium such as one or more of system memory 210 or other memory. The operating system provided on I/O controller module 220 may be a mobile device operation system, a desktop/laptop operating system, or another known operating system.

The I/O controller module 220 may operate in conjunction with network adapter 230 and/or storage adapter 235. The network adapter 230 may enable apparatus 205 with the ability to communicate with client devices such as device 105 of FIG. 1, and/or other devices over a communication network. Network adapter 230 may provide wired and/or wireless network connections. In some cases, network adapter 230 may include an Ethernet adapter or Fibre Channel adapter. Storage adapter 235 may enable apparatus 205 to access one or more data storage devices such as storage device 110. The one or more data storage devices may include two or more data tiers each. The storage adapter 235 may include one or more of an Ethernet adapter, a Fibre Channel adapter, Fibre Channel Protocol (FCP) adapter, a SCSI adapter, and iSCSI protocol adapter.

Figure 3:
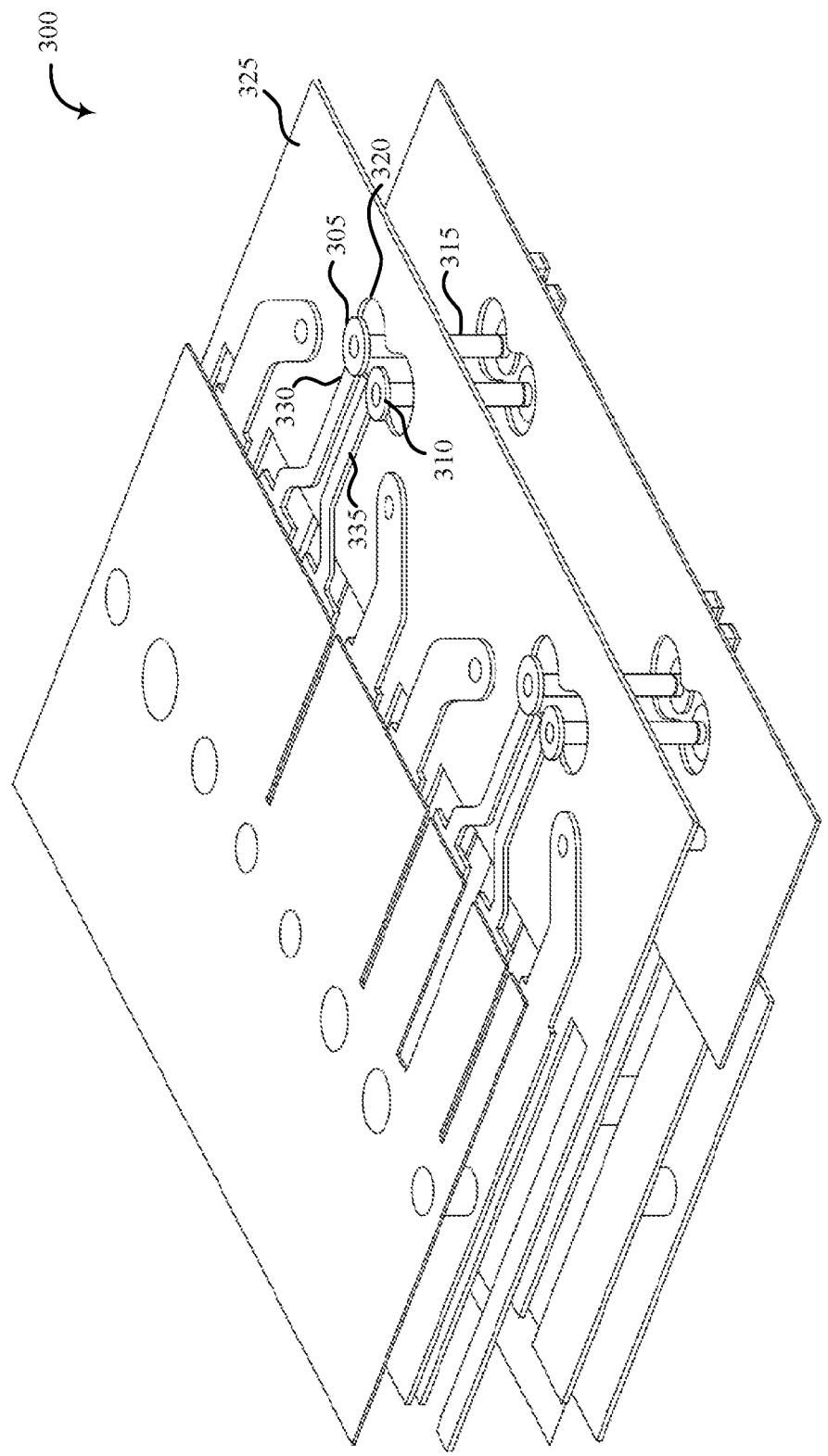
FIG. 3 shows one embodiment of an environment in accordance with various aspects of this disclosure.

FIG. 3 shows printed circuit board (PCB) 300 for tightly coupled differential vias, in accordance with various examples. As shown, PCB 300 may depict a portion of an entire PCB. At least one aspect of PCB 300 may be implemented in conjunction with device 105 of FIG. 1, apparatus 205 of FIG. 2, and/or placement module 145 depicted in FIGS. 1 and/or 2.

As depicted, PCB 300 includes first via 305, second via 310, barrel 315 of first via 305, antipad 320, first layer 325 of PCB 300, first trace 330 connected to first via 305, and second trace 335 connected to second via 310. In some embodiments, the first via and/or the second via may include at least one of a barrel, a pad, and an antipad, or any combination thereof. First trace 330 may include a top trace, an inner trace, or a bottom trace. Second trace 335 may include a top trace, an inner trace, or a bottom trace.

In some cases, PCB 300 may be a PCB of a storage drive. Alternatively, PCB 300 may be a PCB of an electronic device other than a storage drive. In one embodiment, the first via or the second via may include a hole drilled through one or more layers of the PCB 300. In one embodiment, barrel 315 may include a conductive tube that fills or lines the drilled hole. In some cases, antipad 320 may include a clearance hole between barrel 315 and at least one metal layer, the antipad 320 separating barrel 315 from the metal layer. For example, antipad 320 may separate the barrel 315 from a copper or metal plane such as a ground plane or a reference plane. The reference plane may be referred to as a power plane.

As illustrated, antipad 320 physically separates barrel 315 from at least first layer 325. As illustrated, antipad 320 may be on a first layer 325 of PCB 300, or a same layer as first trace 330. In some cases, the spacing or clearance of antipad 320 may be based at least in part on a selected single ended impedance of first via 305, based at least in part on a selected single ended impedance of second via 310, or based at least in part on a selected differential impedance between the first via and the second via, or any combination thereof. In some embodiments, a spacing between antipad 320 and a conductive edge of the first via may be 1.5 times or less a width between first trace 330 and second trace 335.

In one embodiment, first via 305 and second via 310 electrically connect a serializer/deserializer (SerDes) of a connector of a storage drive to a SerDes of a controller of the storage drive. In some cases, the storage drive connector includes at least one of a serial advanced technology attachment (SATA) connector, mini SATA (mSATA) connector, SATA Express connector, small computer system interface (SCSI) connector, serially attached SCSI (SAS) connector, peripheral component interconnect express (PCIe) connector, M.2 connector, U.2 connector, non-volatile memory express (NVMe) connector, a universal serial bus (USB) connector, or any combination thereof.

Figure 4:
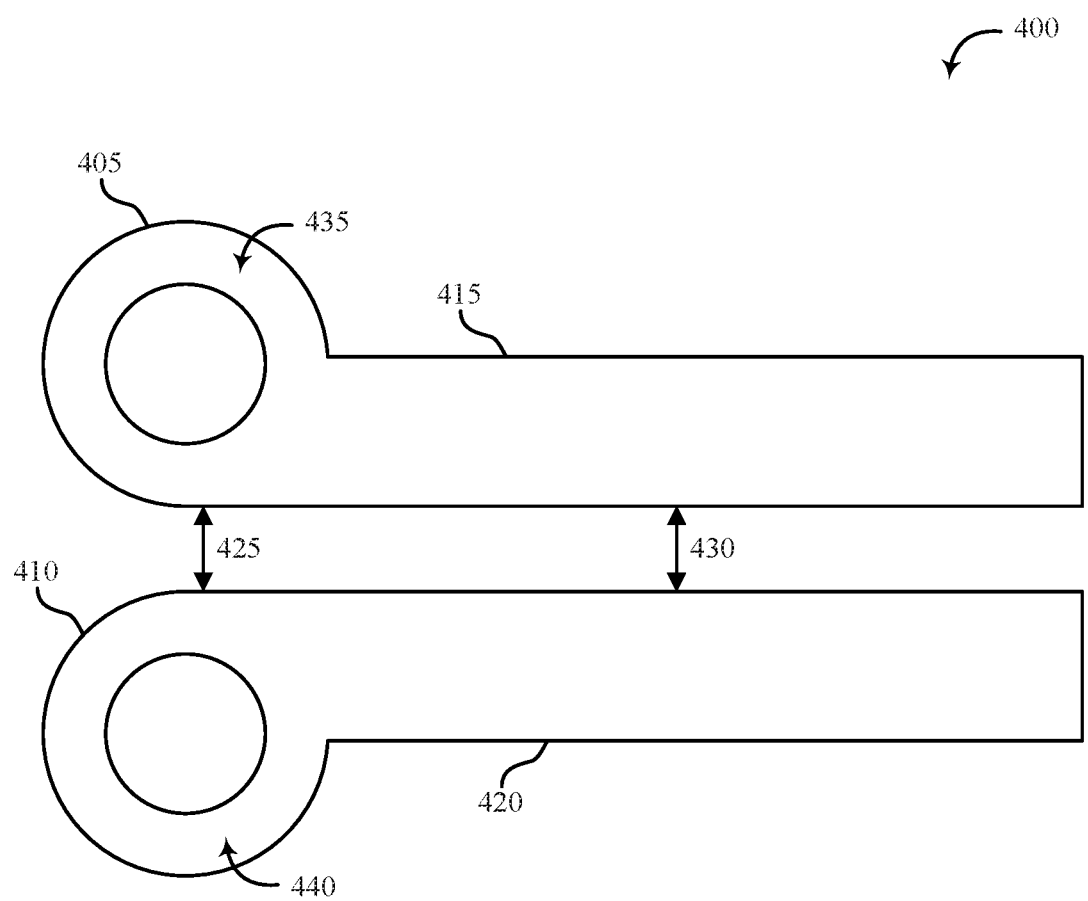
FIG. 4 shows one embodiment of an environment in accordance with various aspects of this disclosure.

FIG. 4 shows an environment 400 for tightly coupled differential vias, in accordance with various examples. The environment 400 may be one example of PCB 300 of FIG. 3. At least one aspect of environment 400 may be implemented in conjunction with device 105 of FIG. 1, apparatus 205 of FIG. 2, and/or placement module 145 depicted in FIGS. 1 and/or 2.

As depicted, environment 400 may include first via 405, second via 410, first trace 415, second trace 420, first pad 435 of first via 405, and second pad 440 of second via 410. As depicted, first via 405 connects electrically to first trace 415. Also, second via 410 connects electrically to second trace 420. In some cases, first trace 415 and second trace 420 may be routed on a first layer of a PCB.

In one embodiment, first pad 435 may connect each end of a barrel of first via 405 to a component, a plane, and/or a trace such as first trace 415. Additionally or alternatively, second pad 440 may connect each end of a barrel of second via 410 to a component, a plane, and/or a trace such as second trace 420.

As illustrated, via distance 425 may indicate a distance between an edge of first via 405 and an edge of second via 410. For example, distance 425 may represent a distance between an edge of first pad 435 and an edge of second pad 440. Similarly trace distance 430 may indicate a distance between first trace 415 and second trace 420. In some cases, trace distance 430 may be referred to as a trace-to-trace width.

In some embodiments, via distance 420 may be similar or equal to trace distance 430. In one example, via distance 420 may be about 1.5 times or less trace distance 430. For instance, when trace distance 430 is 6 mils, then via distance 420 may be 9 mils or less. In one example, via distance 420 may be within about 0.8 and about 1.2 times trace distance 430. For instance, when trace distance 430 is 6 mils, then via distance 420 may be anywhere from about 4.8 mils to about 7.2 mils. In one example, via distance 420 may be within about 0.5 and about 1.5 times trace distance 430. For instance, when trace distance 430 is 6 mils, then via distance 420 may be anywhere from about 3 mils to about 9 mils.

In one embodiment, the first via 405 may include a through hole via, a blind via, or a buried via. Additionally or alternatively, the second via 410 may include a through hole via, a blind via, or a buried via. In one embodiment, the first via may include at least one of a barrel, a pad such as pad 435, and an antipad, or any combination thereof. In some cases, the barrel and/or the pad of first via 405 may include a conductive edge. Additionally or alternatively, the second via 410 may include at least one of a barrel, a pad such as pad 440, and an antipad, or any combination thereof. In some cases, the barrel and/or the pad of second via 410 may include a conductive edge.

Figure 5:
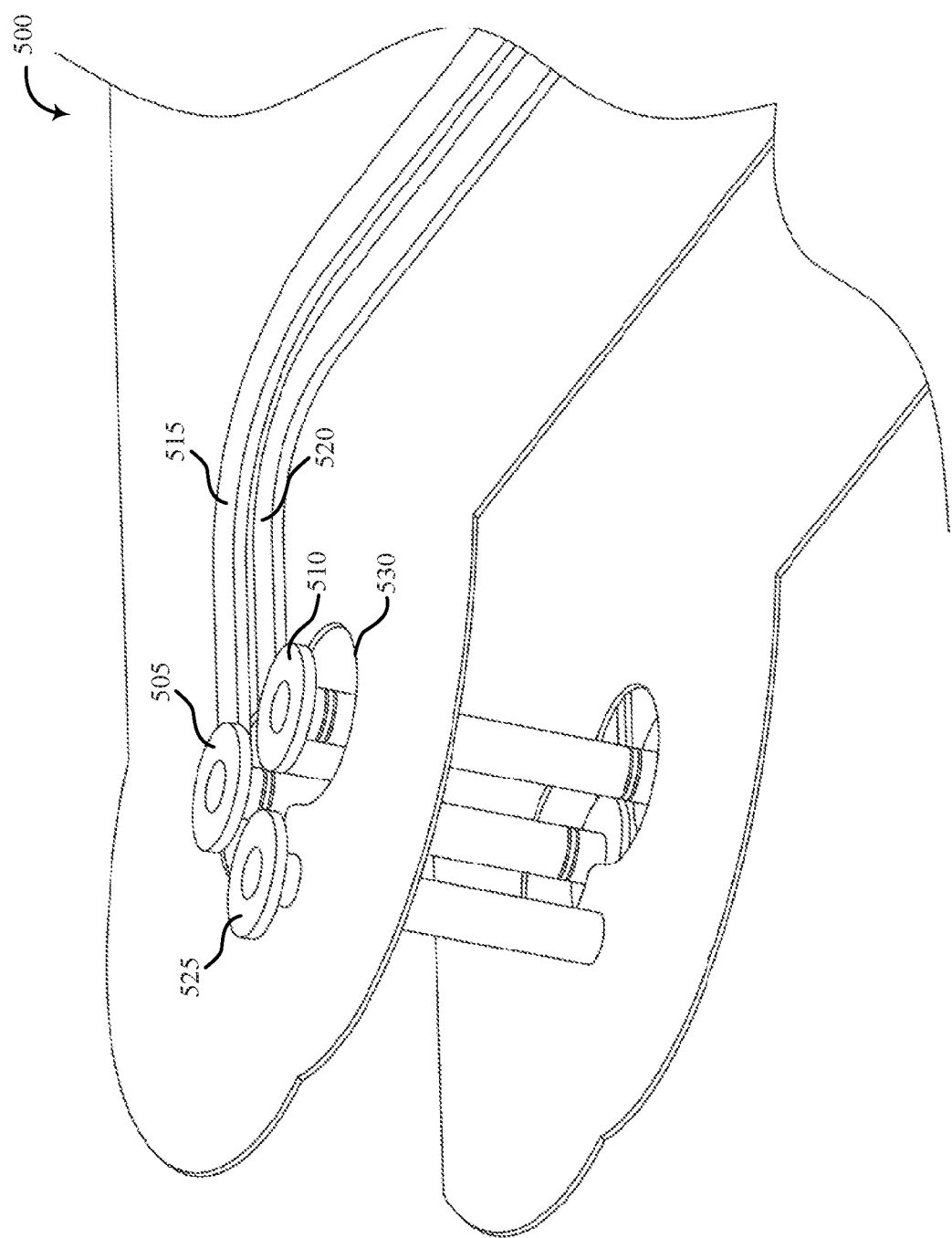
FIG. 5 shows one embodiment of an environment in accordance with various aspects of this disclosure.

FIG. 5 shows a PCB 500 for tightly coupled differential vias, in accordance with various examples. PCB 500 may be one example of PCB 300 of FIG. 3 and/or environment 400 of FIG. 4. At least one aspect of PCB 500 may be implemented in conjunction with device 105 of FIG. 1, apparatus 205 of FIG. 2, and/or placement module 145 depicted in FIGS. 1 and/or 2.

As depicted, PCB 500 may include first via 505, second via 510, first trace 515, second trace 520, ground via 525, and antipad 530. As illustrated, PCB 500 includes ground via 525 placed relatively near first via 505 and second via 510. In some cases, a spacing or distance between a conductive edge of the ground via 525 and a conductive edge of the first via may be about 1.5 times or less a width between first trace 515 and second trace 520. For example, when a distance between first trace 515 and second trace 520 is 6 mils, a distance between a conductive edge of the ground via 525 and a conductive edge of the first via may be about 9 mils or less. Additionally or alternatively, a spacing or distance between the conductive edge of ground via 525 and a conductive edge of the second via 510 may be about 1.5 times or less a width between first trace 515 and second trace 520.

As show, the first trace 515 extends out from the first via 505 and the second trace 520 extends out from the second via 510. In some cases, the first trace 515 extends out from the first via 505 parallel with the second trace 520. In some embodiments, the first trace 515 and the second trace 520 bend away together from the first via 505 and the second via 510 after extending out, respectively, from the first via 505 and the second via 510. In some cases, a predetermined trace width between the first trace 515 and the second trace 520 may be maintained before, during, and after the illustrating bending away. In some embodiments, the first via 505 may electrically connect the first trace 515 to a second layer of the PCB 505 and the second via 510 may electrically connect the second trace 520 to the second layer of the PCB. In some cases, the first via 505 may connect to a first inner trace of the second layer and/or the second via 510 may connect to a second inner trace on the second layer.

Figure 6:
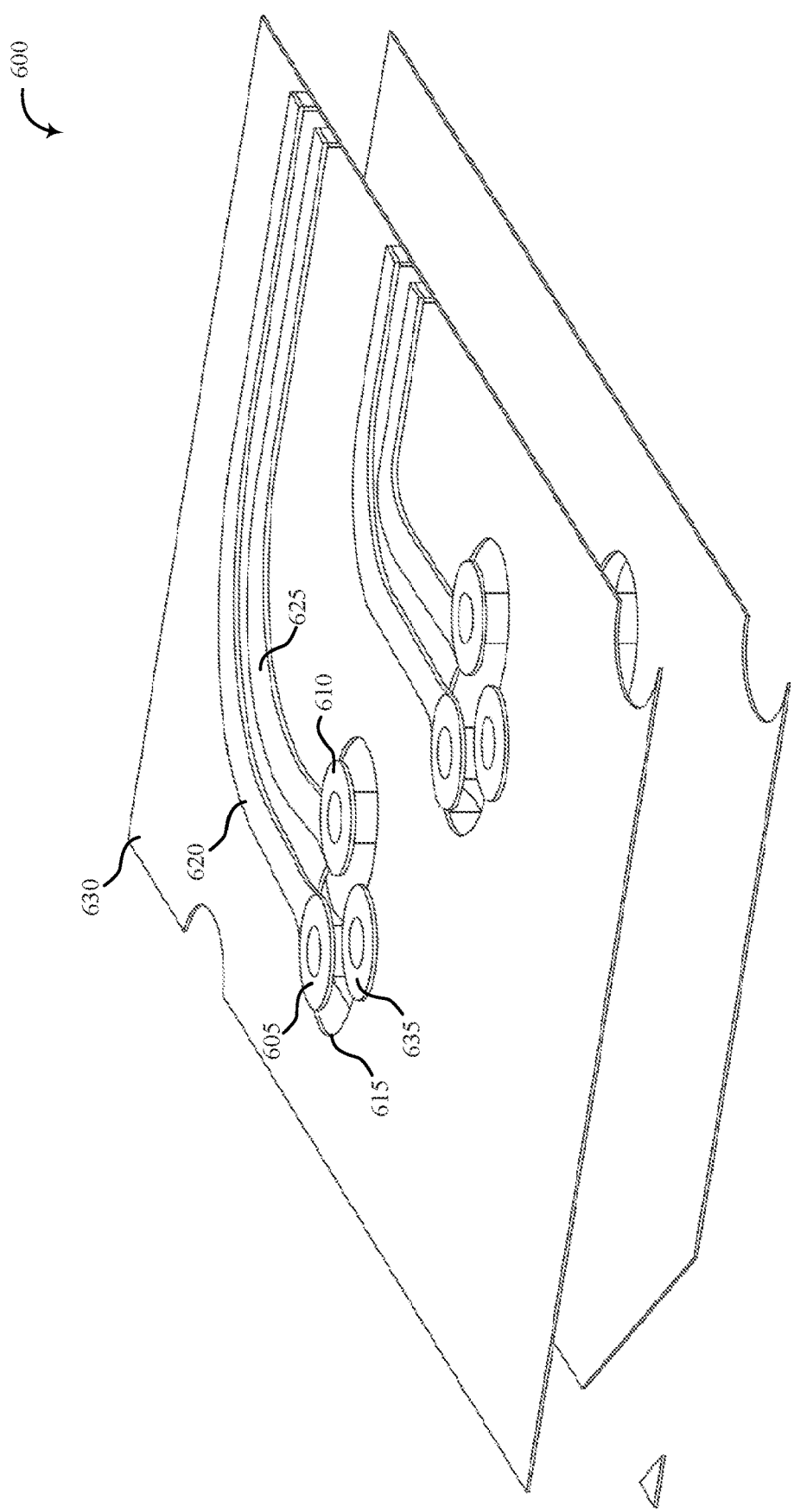
FIG. 6 shows one embodiment of an environment in accordance with various aspects of this disclosure.

FIG. 6 shows a PCB 600 for tightly coupled differential vias, in accordance with various examples. PCB 600 may be one example of PCB 300 of FIG. 3, environment 400 of FIG. 4, and/or PCB 500 of FIG. 5. At least one aspect of PCB 600 may be implemented in conjunction with device 105 of FIG. 1, apparatus 205 of FIG. 2, and/or placement module 145 depicted in FIGS. 1 and/or 2.

As depicted, PCB 600 may include first via 605, second via 610, antipad 615, first trace 620, second trace 625, first layer 630, and ground via 635. As illustrated, the first trace 620 and the second trace 625 may together bend away, respectively, from the first via 605 and the second via 610 after extending out, respectively, from the first via 605 and the second via 610. In some cases, a predetermined trace width between the first trace and the second trace may be maintained before, during, and after the bending away. In one embodiment, first via 605 and second via 610 may be a first pair of differential of vias of PCB 630, and first trace 620 and second trace 625 may be first differentially paired traces. As shown, PCB 630 may include one or more additional pair of differential vias and/or one or more additional differentially paired traces. For example, as illustrated the same bending away of traces may occur on a second differential pair of vias of PCB 630. In one embodiment, ground via 635 may be placed relatively near first via 605 and second via 610. In some cases, no antipad may be placed around ground via 635 on first layer 630. Thus, in one embodiment first layer 630 may be a ground layer in which ground via 635 connects electrically to first layer 630.

In one embodiment, a differential impedance between first via 605 and second via 610 may depend on at least one or more physical aspects of first via 606, second via 610, and/or antipad 715. In one embodiment, the one or more physical aspects of first via 605 and second via 610 may include at least one of a distance between first via 605 and second via 610, a width of a pad of first via 605, a width of a pad of second via 610, a distance between an antipad of first via 605 and first via 605, a distance between an antipad of second via 610 and second via 610, a width of a barrel of first via 605, a width of a barrel of second via 610, a height of a barrel of first via 605, a height of a barrel of second via 610, a dimension of a first reference plane, a dimension of a second reference plane, a distance between first via 605 and the first or second reference plane, a distance between second via 610 and the first or second reference plane, or any combination thereof.

Figure 7:
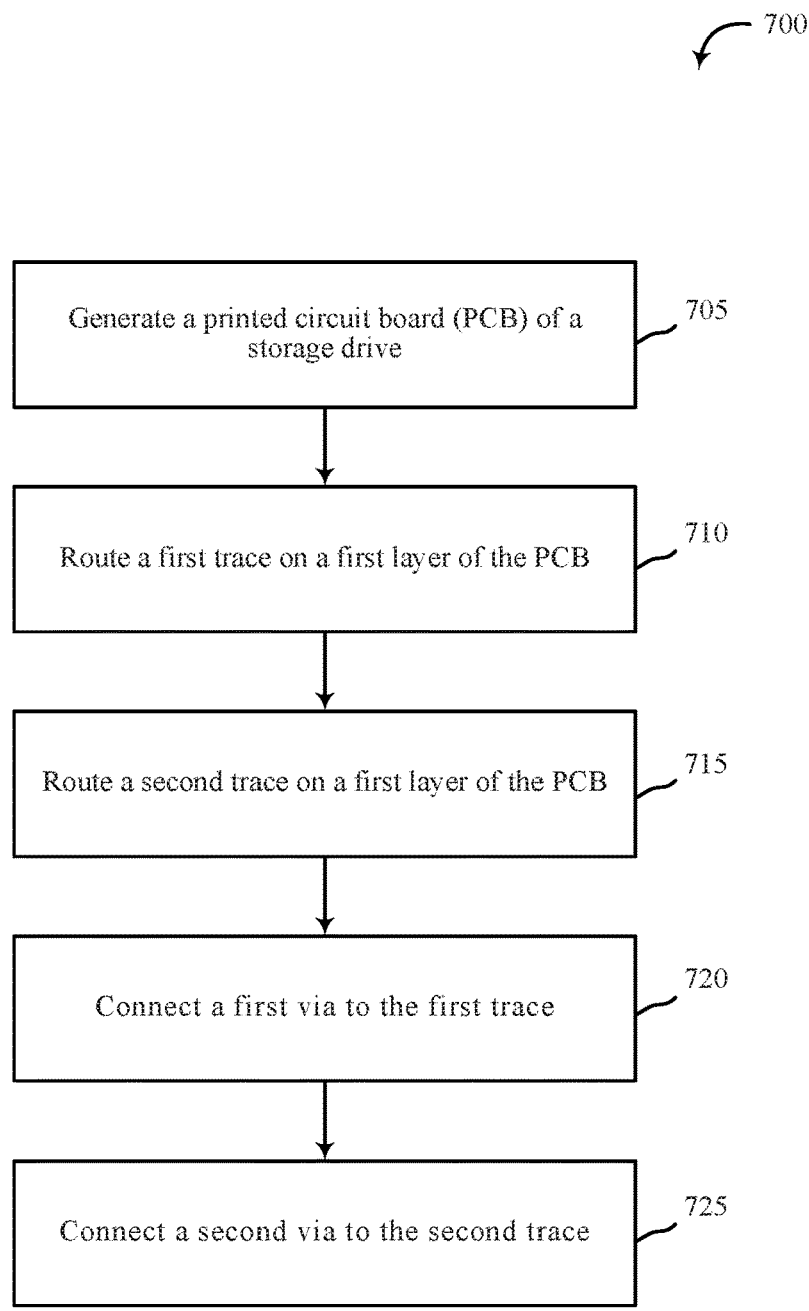
FIG. 7 is a flow chart illustrating an example of a method in accordance with various aspects of this disclosure.

FIG. 7 is a flow chart illustrating an example of a method 700 for tightly coupled differential vias, in accordance with various aspects of the present disclosure. One or more aspects of the method 700 may be implemented in conjunction with device 105 of FIG. 1, apparatus 205 of FIG. 2, and/or placement module 145 depicted in FIGS. 1 and/or 2. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 705, the method 700 may include generating a printed circuit board (PCB) of a storage drive. At block 710, the method 700 may include routing a first trace on a first layer of the PCB. At block 715, the method 700 may include routing a second trace on a first layer of the PCB. At block 720, the method 700 may include connecting a first via to the first trace. At block 725, the method 700 may include connecting a second via to the second trace.

The operations at blocks 705-725 may be performed using the placement module 145 described with reference to FIGS. 1 and 2 and/or another module. Thus, the method 700 may provide for tightly coupled differential vias. It should be noted that the method 700 is just one implementation and that the operations of the method 700 may be rearranged, omitted, and/or otherwise modified such that other implementations are possible and contemplated.

Figure 8:
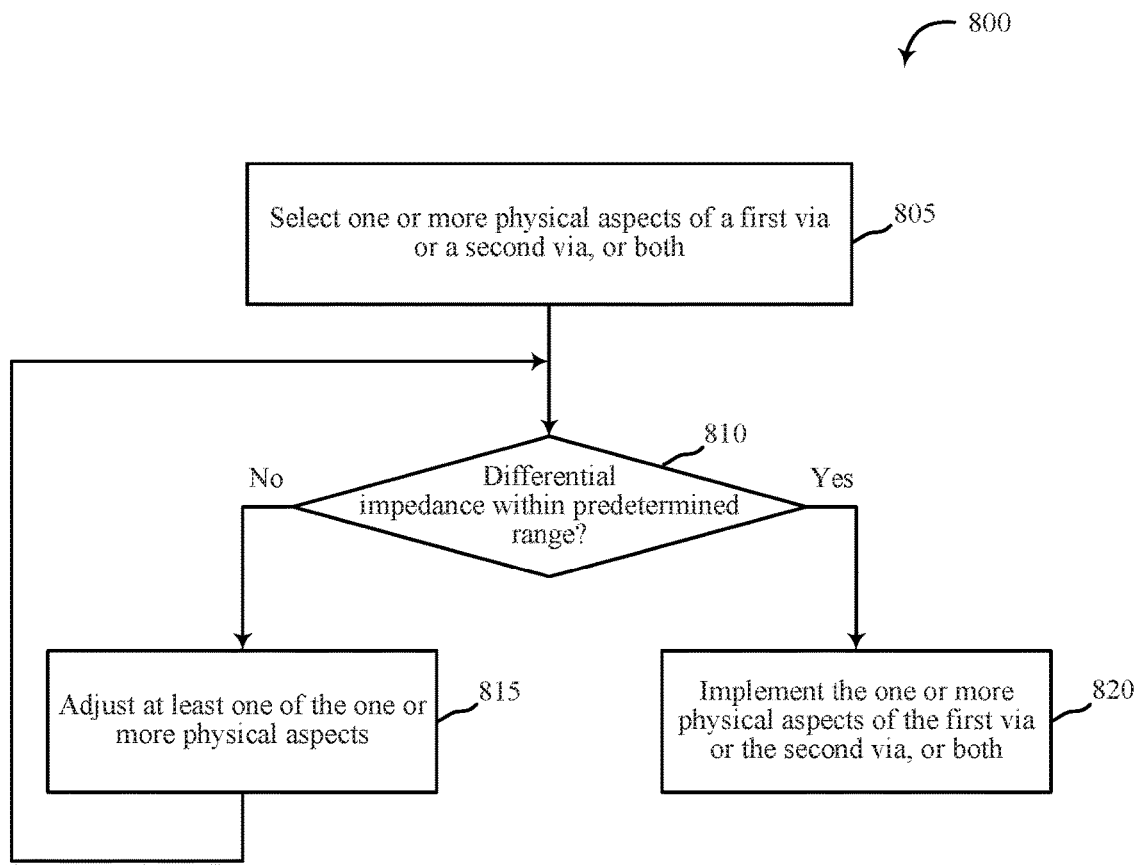
FIG. 8 is a flow chart illustrating an example of a method in accordance with various aspects of this disclosure.

FIG. 8 is a flow chart illustrating an example of a method 800 for tightly coupled differential vias, in accordance with various aspects of the present disclosure. One or more aspects of the method 800 may be implemented in conjunction with device 105 of FIG. 1, apparatus 205 of FIG. 2, and/or placement module 145 depicted in FIGS. 1 and/or 2. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 805, the method 800 may include selecting one or more physical aspects of a first via or a second via, or both. At block 810, the method 800 may include determining whether a differential impedance associated with the first via and the second via is within predetermined range. At block 815, upon determining the differential impedance is not within the predetermined range, the method 800 may include adjusting at least one of the one or more physical aspects of the first via and/or second via. At block 820, upon determining the differential impedance is within the predetermined range, the method 800 may include implementing the one or more physical aspects of the first via or the second via, or both.

The operation(s) at block 805-820 may be performed using the placement module 145 described with reference to FIGS. 1 and 2 and/or another module. Thus, the method 800 may provide for tightly coupled differential vias. It should be noted that the method 800 is just one implementation and that the operations of the method 800 may be rearranged, omitted, and/or otherwise modified such that other implementations are possible and contemplated.

In some examples, aspects from two or more of the methods 700 and 800 may be combined and/or separated. It should be noted that the methods 700 and 800 are just example implementations, and that the operations of the methods 700 and 800 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, for example, a combination of a DSP and a microprocessor, multiple microprocessors, one or more microprocessors in conjunction with a DSP core, and/or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC, or A and B and C.

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, or wireless technologies such as infrared, radio, and/or microwave are included in the definition of medium. Disk and disc, as used herein, include any combination of compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A storage system comprising:
a storage drive;
a printed circuit board (PCB) of the storage drive;
a first via connected to a first trace routed on a first layer of the PCB;
a second via connected to a second trace routed on the first layer of the PCB, a distance between the first via and the second via being 1.5 times or less a spacing between the first trace and the second trace; and
the first via and the second via electrically connecting a serializer/deserializer (SerDes) of a connector of the storage drive to a SerDes of a hardware controller of the storage drive.

2. The storage system of claim 1, the storage system further comprising:
a ground via placed relatively near the first via and the second via, wherein a spacing between a conductive edge of the ground via and a conductive edge of the first via or between the conductive edge of the ground via and a conductive edge of the second via is 1.5 times or less a width between the first trace and the second trace.

3. The storage system of claim 1, wherein:
the first trace extends out from the first via and the second trace extends out from the second via in parallel; and
the first trace and the second trace together bend away from the first via and the second via after extending out from the first via and the second via, a predetermined trace width between the first trace and the second trace being maintained before, during, and after the bending away.

4. The storage system of claim 1, the storage system further comprising:
a first antipad on the first layer of the PCB surrounding the first via, a spacing between the first antipad and a conductive edge of the first via being 1.5 times or less a width between the first trace and the second trace, the spacing based at least in part on a selected single ended impedance of the first via or a selected differential impedance between the first via and the second via, or both.

5. The storage system of claim 1, wherein:
the first via and the second via are differentially paired vias; and
the first trace and the second trace are differentially paired traces, the first via electrically connecting the first trace to a second layer of the PCB and the second via electrically connecting the second trace to the second layer of the PCB.

6. The storage system of claim 1, wherein:
the first via or the second via include a through hole via, a blind via, or a buried via, the first via or the second via including at least one of a barrel, a pad, and an antipad, or any combination thereof, the barrel or the pad, or both, including a conductive edge.

7. The storage system of claim 1, wherein:
the storage drive connector includes at least one of a serial advanced technology attachment (SATA) connector, mini SATA (mSATA) connector, SATA Express connector, small computer system interface (SCSI) connector, serially attached SCSI (SAS) connector, peripheral component interconnect express (PCIe) connector, M.2 connector, U.2 connector, non-volatile memory express (NVMe) connector, a universal serial bus (USB) connector, or any combination thereof.

8. The storage system of claim 1, wherein:
a differential impedance between the first via and the second via depends on at least one or more physical aspects of the first via and the second via.

9. The storage system of claim 8, wherein:
the one or more physical aspects of the first via and the second via includes at least one of a distance between the first via and the second via, a width of a pad of the first via, a width of a pad of the second via, a width of a barrel of the first via, a width of a barrel of the second via, a height of a barrel of the first via, a height of a barrel of the second via, a dimension of a first reference plane, a dimension of a second reference plane, a distance between the first via and the first or second reference plane, a distance between the second via and the first or second reference plane, or any combination thereof.

10. An apparatus comprising:
a printed circuit board (PCB);
a first via connected to a first trace routed on a first layer of the PCB;
a second via connected to a second trace routed on the first layer of the PCB, a distance between the first via and the second via being 1.5 times or less than a distance between the first trace and the second trace; and
the first via and the second via electrically connecting a serializer/deserializer (SerDes) of a connector of the apparatus to a SerDes of a hardware controller of the apparatus.

11. The apparatus of claim 10, comprising:
a ground via placed relatively near the first via and the second via, wherein a spacing between a conductive edge of the ground via and a conductive edge of the first via or between the conductive edge of the ground via and a conductive edge of the second via is 1.5 times or less a width between the first trace and the second trace.

12. The apparatus of claim 10, wherein:
the first trace extends out from the first via and the second trace extends out from the second via in parallel; and
the first trace and the second trace together bend away from the first via and the second via after extending out from the first via and the second via, a predetermined trace width between the first trace and the second trace being maintained before, during, and after the bending away.

13. The apparatus of claim 10, comprising:
a first antipad on the first layer of the PCB surrounding the first via, a spacing between the first antipad and a conductive edge of the first via being 1.5 times or less a width between the first trace and the second trace, the spacing based at least in part on a selected single ended impedance of the first via or a selected differential impedance between the first via and the second via, or both.

14. The apparatus of claim 10, wherein:
the first via and the second via are differentially paired vias; and
the first trace and the second trace are differentially paired traces, the first via electrically connecting the first trace to a second layer of the PCB and the second via electrically connecting the second trace to the second layer of the PCB.

15. The apparatus of claim 10, wherein:
the first via or the second via include a through hole via, a blind via, or a buried via, the first via or the second via including at least one of a barrel, a pad, and an antipad, or any combination thereof, the barrel or the pad, or both, including a conductive edge.

16. The apparatus of claim 10, wherein:
the apparatus connector includes at least one of a serial advanced technology attachment (SATA) connector, mini SATA (mSATA) connector, SATA Express connector, small computer system interface (SCSI) connector, serially attached SCSI (SAS) connector, peripheral component interconnect express (PCIe) connector, M.2 connector, U.2 connector, non-volatile memory express (NVMe) connector, a universal serial bus (USB) connector, or any combination thereof.

17. A method comprising:
connecting a first via to a first trace routed on a first layer of a printed circuit board (PCB) of a storage drive;
connecting a second via to a second trace routed on the first layer of the PCB, a distance between the first via and the second via being 1.5 times or less than a spacing between the first trace and the second trace, the first via and the second via electrically connecting a serializer/deserializer (SerDes) of a connector of the storage drive to a SerDes of a hardware controller of the storage drive; and
placing a ground via adjacent to the first via and the second via, placement of the first via, the second via, or the ground via, or any combination thereof, enabling at least one of a predetermined differential impedance of the first via and the second via, a predetermined single ended impedance of the first via or the second via, and a minimization of crosstalk between the first and second vias and a second pair of vias.

18. The method of claim 17, wherein:
a spacing between a conductive edge of the ground via and a conductive edge of the first via or between the conductive edge of the ground via and a conductive edge of the second via being 1.5 times or less the spacing between the first trace and the second trace.

* * * * *